United States Patent
Guo et al.

(10) Patent No.: US 10,872,832 B2
(45) Date of Patent: Dec. 22, 2020

(54) PRE-MOLDED ACTIVE IC OF PASSIVE COMPONENTS TO MINIATURIZE SYSTEM IN PACKAGE

(71) Applicant: Intel Corporation, Santa Clara, CA (US)

(72) Inventors: Mao Guo, Shanghai (CN); John G. Meyers, Sacramento, CA (US); Yong She, Songjiang (CN); Bin Liu, Shanghai (CN); Lingyan L. Tan, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/772,483

(22) PCT Filed: Dec. 16, 2015

(86) PCT No.: PCT/CN2015/097545
§ 371 (c)(1),
(2) Date: Apr. 30, 2018

(87) PCT Pub. No.: WO2017/101037
PCT Pub. Date: Jun. 22, 2017

(65) Prior Publication Data
US 2018/0331004 A1    Nov. 15, 2018

(51) Int. Cl.
*H01L 23/28* (2006.01)
*H01L 23/538* (2006.01)
(Continued)

(52) U.S. Cl.
CPC .............. *H01L 23/28* (2013.01); *H01L 23/02* (2013.01); *H01L 23/5385* (2013.01);
(Continued)

(58) Field of Classification Search
CPC ..... H01L 23/02; H01L 23/28; H01L 23/3128; H01L 23/5385; H01L 25/065; H01L 25/0657; H01L 25/105; H01L 25/50
See application file for complete search history.

(56) References Cited

U.S. PATENT DOCUMENTS 6,781,243 B1    8/2004  Li et al.
7,242,081 B1 *  7/2007  Lee ..................... H01L 25/0657
                                            257/686
(Continued)

FOREIGN PATENT DOCUMENTS

KR    102012007239    7/2012
TW    201201298      1/2012

OTHER PUBLICATIONS

International Search Report and Written Opinion for International Patent Application No. PCT/CN2015/097545 dated Sep. 22, 2016, 12 pgs.
(Continued)

*Primary Examiner* — Peniel M Gumedzoe
(74) *Attorney, Agent, or Firm* — Schwabe, Williamson & Wyatt, P.C.

(57) ABSTRACT

A system in package and method of making as system in package are disclosed. The system in package has a substrate (102) with a plurality of passive devices (104) mounted thereon. A molding compound (106) envelopes the plurality of passive devices (104) to define a flat surface (116) substantially parallel to a surface of the substrate (102). A plurality of integrated circuit dies (110) is coupled successively to the flat surface (116).

19 Claims, 6 Drawing Sheets

(51) Int. Cl.
    *H01L 25/065*     (2006.01)
    *H01L 25/10*     (2006.01)
    *H01L 25/00*     (2006.01)
    *H01L 23/02*     (2006.01)
    *H01L 23/31*     (2006.01)

(52) U.S. Cl.
    CPC ........ *H01L 25/065* (2013.01); *H01L 25/0657* (2013.01); *H01L 25/105* (2013.01); *H01L 25/50* (2013.01); *H01L 23/3128* (2013.01); *H01L 2224/32145* (2013.01); *H01L 2224/48227* (2013.01); *H01L 2224/73265* (2013.01); *H01L 2225/0651* (2013.01); *H01L 2225/06506* (2013.01); *H01L 2225/06555* (2013.01); *H01L 2225/06562* (2013.01); *H01L 2924/15311* (2013.01); *H01L 2924/181* (2013.01)

(56) References Cited

U.S. PATENT DOCUMENTS

| | | | | |
|---|---|---|---|---|
| 2005/0282310 A1* | 12/2005 | Zhou | ............... | G06K 9/0002 438/107 |
| 2006/0245308 A1* | 11/2006 | Macropoulos | ......... | H05K 1/024 369/1 |
| 2006/0267173 A1 | 11/2006 | Takiar et al. | | |
| 2007/0096282 A1* | 5/2007 | Shim | ............... | H01L 23/49811 257/686 |
| 2007/0138635 A1* | 6/2007 | Ikumo | ............... | H01L 23/3171 257/738 |
| 2008/0093723 A1* | 4/2008 | Myers | ............... | H01L 25/0657 257/686 |
| 2008/0164587 A1 | 7/2008 | Park et al. | | |
| 2010/0230789 A1* | 9/2010 | Yorita | ............... | H01L 23/3121 257/659 |
| 2010/0244585 A1* | 9/2010 | Tan | ............... | H01G 4/183 307/109 |
| 2011/0115100 A1* | 5/2011 | Okumura | ............... | H01L 24/49 257/782 |
| 2011/0304062 A1* | 12/2011 | Hsu | ............... | B29C 45/0055 257/787 |
| 2012/0133427 A1* | 5/2012 | Kim | ............... | H01L 23/34 327/564 |
| 2012/0317332 A1* | 12/2012 | Kwak | ............... | G06F 12/0246 711/102 |
| 2012/0326291 A1* | 12/2012 | Choi | ............... | H01L 23/4334 257/687 |
| 2013/0301228 A1* | 11/2013 | Tao | ............... | H01L 21/561 361/748 |
| 2014/0203395 A1 | 7/2014 | Tsai et al. | | |
| 2015/0130041 A1* | 5/2015 | Seo | ............... | H01L 23/3128 257/686 |
| 2015/0179570 A1* | 6/2015 | Marimuthu | ......... | H01L 25/0652 257/774 |
| 2016/0056136 A1* | 2/2016 | McConnelee | ........... | H01L 25/50 257/741 |

OTHER PUBLICATIONS

International Preliminary Report on Patentability for International Patent Application No. PCT/CN2015/097545, dated Jun. 19, 2018, 5 pages.
Office Action from Taiwan Patent Application No. 105135243, dated May 6, 2020, 9 pages.
Office Action from Taiwan Patent Application No. 105135243, dated Oct. 20, 2020, 8 pages.

* cited by examiner

US 10,872,832 B2

PRE-MOLDED ACTIVE IC OF PASSIVE COMPONENTS TO MINIATURIZE SYSTEM IN PACKAGE

CROSS-REFERENCE TO RELATED APPLICATION

This patent application is a U.S. National Phase Application under 35 U.S.C. § 371 of International Application No. PCT/CN2015/097545, filed Dec. 16, 2015, entitled "PRE-MOLDED ACTIVE IC OF PASSIVE COMPONENTS TO MINIATURIZE SYSTEM IN PACKAGE," which designates the United States of America, the entire disclosure of which is hereby incorporated by reference in its entirety and for all purposes.

FIELD

Embodiments of the invention relate to systems in package (SIPs). More specifically, embodiments of the invention relate to reduced area SIPs.

BACKGROUND

Systems in package (SIPs) are becoming increasingly popular as a result of improved performance in small form factors. SIPs integrate active integrated circuit (IC) dies and discrete components, also referred to as passives or passive devices, in a single package. The assembly process for SIPs is quite complex, and that complexity is exacerbated where large numbers of passive devices are needed. In some cases, there may be as many as 200 passive devices in a single SIP. Passive devices, also referred to herein as "passives", include capacitors, inductors, resistors, voltage regulators, transformers and the like.

Historically, the active ICs are coupled onto the surface of the printed circuit board and wire bonded thereto. The passives are distributed around the ICs on the circuit board. As a result, the requirement of large numbers of passives significantly increases the SIP dimension in x and y. Increasingly, the SIPs are used in smaller and thinner form factors such as smart phones, tablets and other mobile devices. As a result, size, both in x and y and also in z, becomes a critical factor.

In an effort to reduce the size, some have tried to embed a percentage of the passives in the printed circuit board (PCB) so that fewer are on the surface, thereby reducing the x and y dimension. However, this possible solution significantly increases the cost and complexity of manufacturing the substrate, increasing costs and reducing yields.

Another proposed solution is to use an interposer to mount passive devices and application-specific integrated circuits (ASICs). The routing requirement for ASIC and passives combined typically requires a six or greater level interposer, which significantly increases z-dimension. The interposer may then be attached on top of a stack of other active ICs and wire bonded to the substrate. The wire bonding and length of the signal path can negatively affect signal quality. Additionally, the cost of the interposer, coupled with the significant increase in z dimension, renders this solution unsuitable for many applications.

Another proposal has been to place the IC dies directly above the passives. To accomplish this, the passives that support the die need to be substantially co-planar. It is quite difficult to ensure a level height of the plurality of passives. There is a significant concern posed by possible tilt during the wire bond process. Additionally, the initial die and the die-attach film attaching the surface of the die to the passives must be thick enough to avoid cracking of that die or other dies in the stack. Generally, high volume manufacturing using this technique has not been found feasible.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
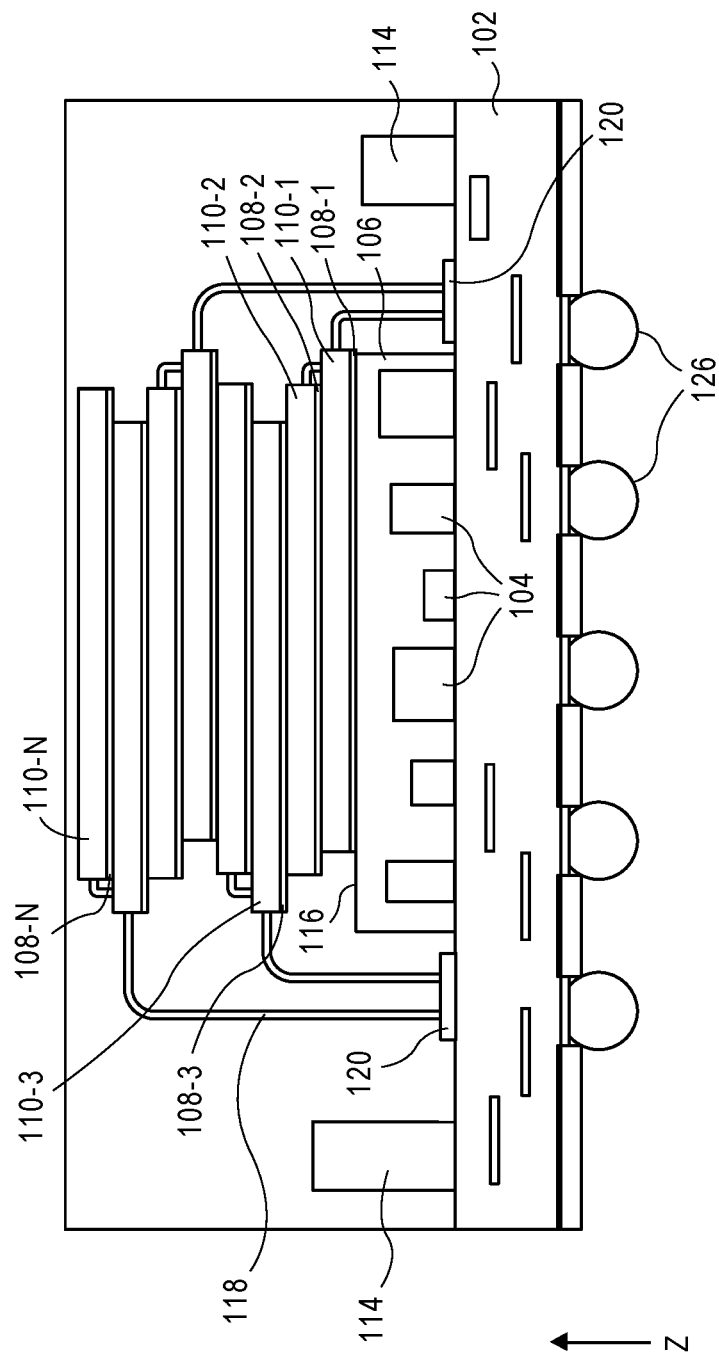
FIG. 1 is a diagram of a system in package according to one embodiment of the invention.

FIG. 1 is a diagram of a system in package according to one embodiment of the invention. A substrate 102 has a plurality of passive devices 104 coupled thereto. The passive devices 104 can be coupled to the substrate using conventional surface mount technology. A molding compound 106 envelopes the passive devices 104 and provides a platform with a level (substantially planar) surface 116. Additional passive devices 114, and particularly those having a z dimension greater than a z dimension of the platform of molding compound 106, are attached to substrate 102 directly, but not encased in molding compound 106.

The level surface 116 allow the mounting of integrated circuit (IC) dies 110-1 . . . 110-$n$ (generically 110) occupying the same x-y space as the passives 104 without the attendant problems of prior art solutions. The first die 110-1 is coupled to the platform surface 116 with a layer of die-attach film (DAF) 108-1. Subsequent dies, e.g., die 110-2, are coupled to a top surface of 110-1 with DAF 108-2. An arbitrary number of dies 110 may be attached. In some embodiments, all dies 110 are the same size and thickness. For example, dies 110-1 through 110-$n$ may all be memory dies, e.g. NAND Flash Memory. In other embodiments, different size dies may appear in the die stack. Unlike the prior art, where thicker DAF and dies are required, when the ICs overlay passives directly, platform 106 provides a level surface to compensate for different heights in the passive devices 104 and allows uniform thickness DAF to be used throughout the device. The ICs 110 are wire bonded to substrate 102 at bonding pads 120. Once all the components are attached to the substrate, further molding is conducted to encase protect the dies and wire bonds. Any conventional packaging process can be used.

Substrate 102 provides a plurality of electrical contacts 126 to facilitate signal passing between the SIP 100 and external devices. Contacts 126 may be arranged as a land grid array (LGA), ball grid array (BGA) or any other conventional arrangement.

Figure 2:
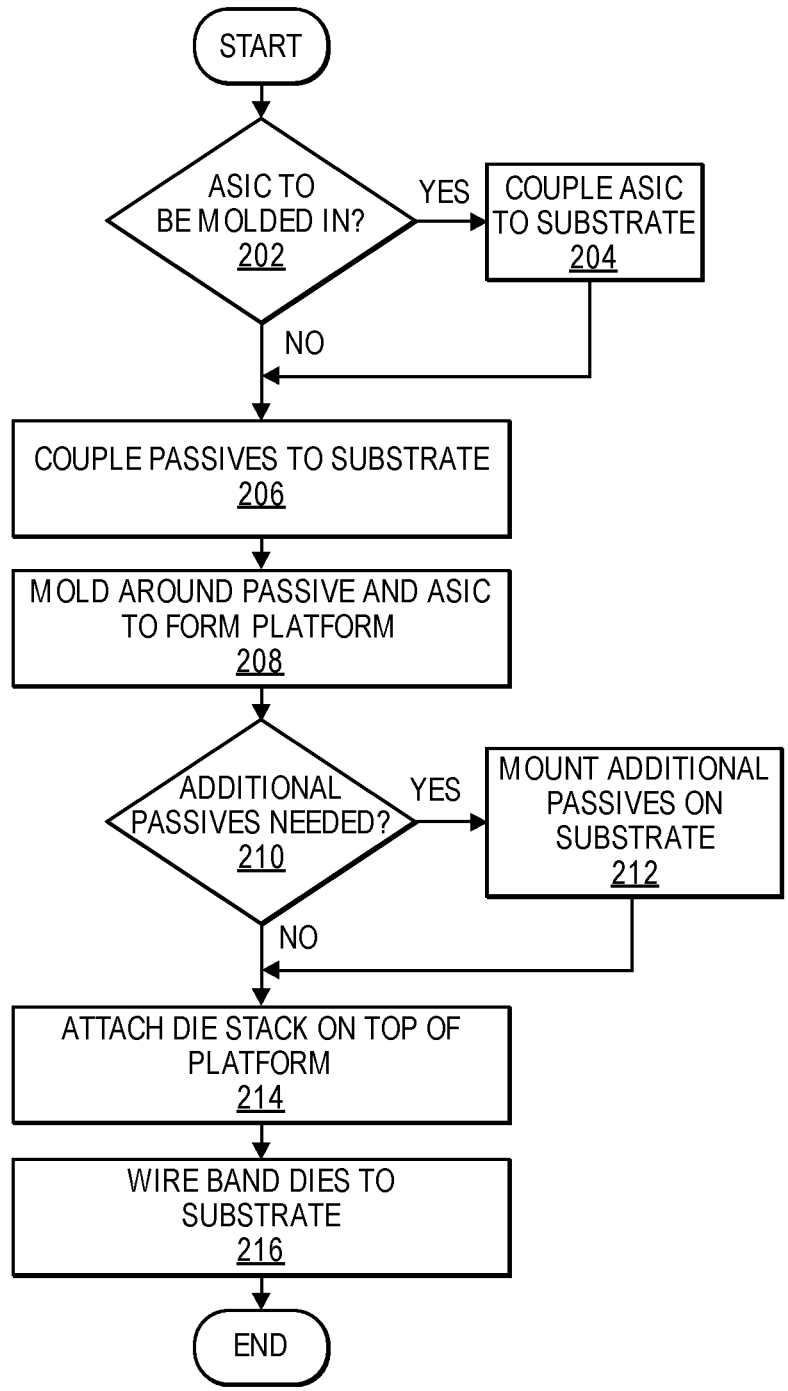
FIG. 2 is a flow diagram of creation of a system in package according to one embodiment of the invention.

FIG. 2 is a flow diagram of creation of a system in package according to one embodiment of the invention. At block 202, a determination is made whether an application-specific integrated circuit (ASIC) is to be included within the molded compound of the SIP. If the ASIC is to be included, the ASIC is coupled to the substrate at block 204. At block 206, passive devices are coupled to the substrate either around the ASIC (if one has been included) or simply in a group where molding can take place. The passive devices may be coupled to the substrate using conventional surface mount technology. The ASIC may be coupled with DAF and wire bonded to the substrate. In some cases, more than one ASIC may be stacked on the substrate with layers of DAF between. The z dimension of the aggregate ASIC stack should not exceed a threshold limited by a desired platform height.

At block 208, a molding compound is introduced to envelope the passives and optional ASIC to form a platform with a substantially planar exposed surface. This molding can be performed using various low pressure conventional molding techniques and an epoxy resin. For example, both channel flow molding and pin gate molding are suitable. In the case of channel molding, a mold is placed over a "channel" along an aggregate substrate and molding compound is flowed along the channel, enveloping the devices therein. The molding compound is then cured to a solid stable form. The individual substrates can then be sectioned from the larger whole. For pin-gate molding, a mold is placed over a discrete area of one substrate; the molding compound is introduced through a pin gate, and cured within the mold. It is desirable to use molding techniques that do not require post processing to achieve the planar surface. However, other molding techniques are within the scope and contemplation of embodiments of the invention.

After the molding compound is introduced around the passive devices, the molding is completed at block 208 when the resin is cured to form a stable platform. A determination is made at decision block 210 if there are additional passive devices required beyond those contained within the platform. If additional passives are required, they are mounted on the substrate at block 214. At block 216, the die stack is attached to the top of the platform. In one embodiment, DAF is used to attach a first die to the exposed planar surface of the platform. Subsequent layers of DAF are used to attach subsequent IC dies into a stack. An arbitrary number of dies may be so stacked, constrained by desired z dimensions and connectivity with the substrate. At block 218, the dies are wire bonded to the substrate using conventional wire bonding techniques. Thereafter, the SIP may be enclosed in a package using conventional semiconductor packaging techniques.

Figure 3A:
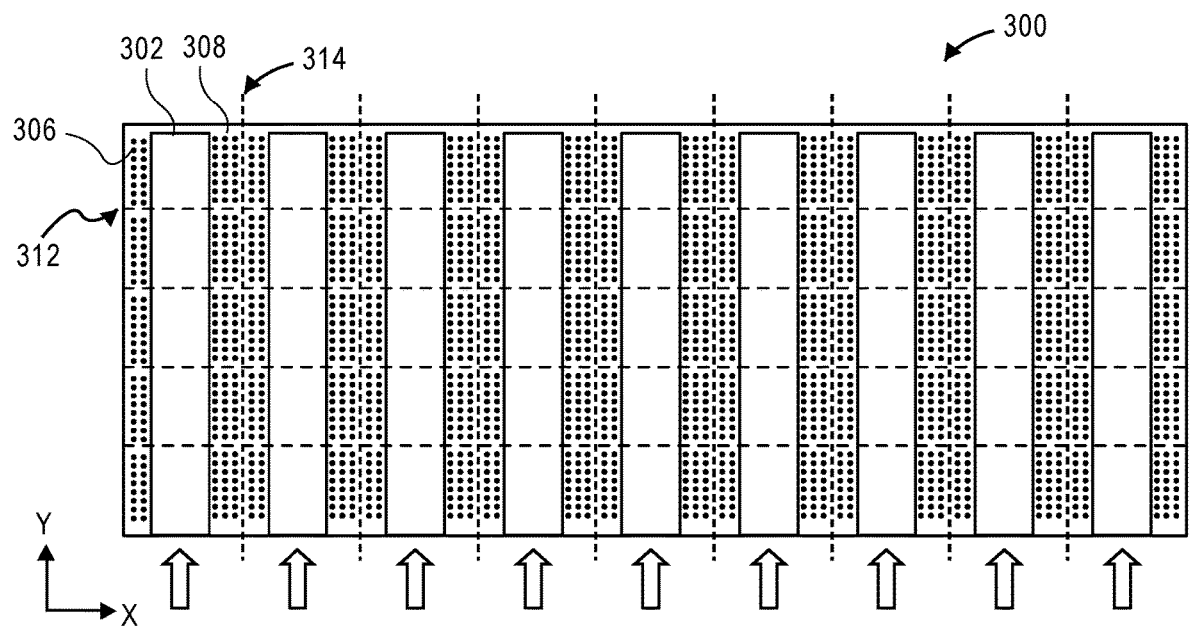
FIG. 3A shows channel molding according to one embodiment of the invention.

FIG. 3A shows channel molding according to one embodiment of the invention. A printed circuit board 300 with multiple chip locations is provided. A channel mold is overlaid on the PCB 300, and molding compound flows down the channel, enveloping devices within the mold. In the shown example, molding compound flows in the y direction. After the molding compound is cured, the individual substrates with mounting platforms are sectional along saw lines 312 and 314.

Figure 3B:
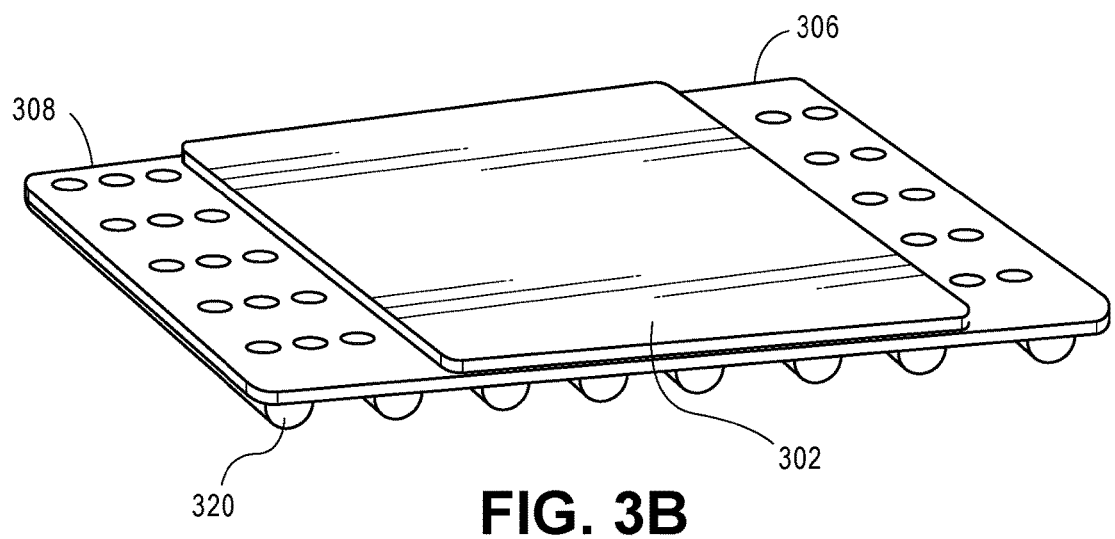
FIG. 3B shows an example of an individual substrate and platform after being sectioned.

FIG. 3B shows an example of an individual substrate and platform after being sectioned. Platform 302 encases passive devices as described above. Areas 308 and 306 are used for wire bonding the integrated circuits and mounting additional passives, as also described above. Contact points 320 allow the substrate to be coupled into a larger system.

Figure 3C:
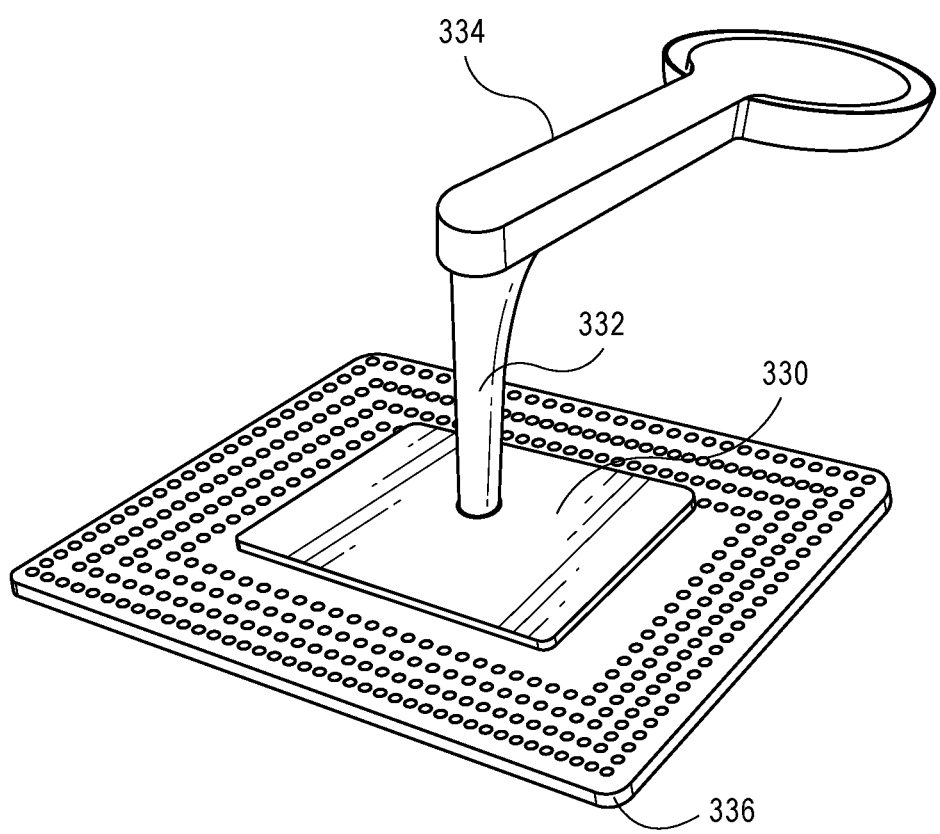
FIG. 3C shows pin molding in an embodiment of the invention.

FIG. 3C shows pin-gate molding in an embodiment of the invention. A robotic arm 334 moves the pin mold 330 over a substrate 336. Molding compound flows through conduit 332 and fills the mold enveloping passive devices contained therein. Pin-gate molding requires slightly larger areas surrounding the mold 330 on the substrate 336 than the channel molding example above. However, it is particularly well-suited where it is desirable to have contacts on all sides of the platform and ultimate die stack.

Figure 4:
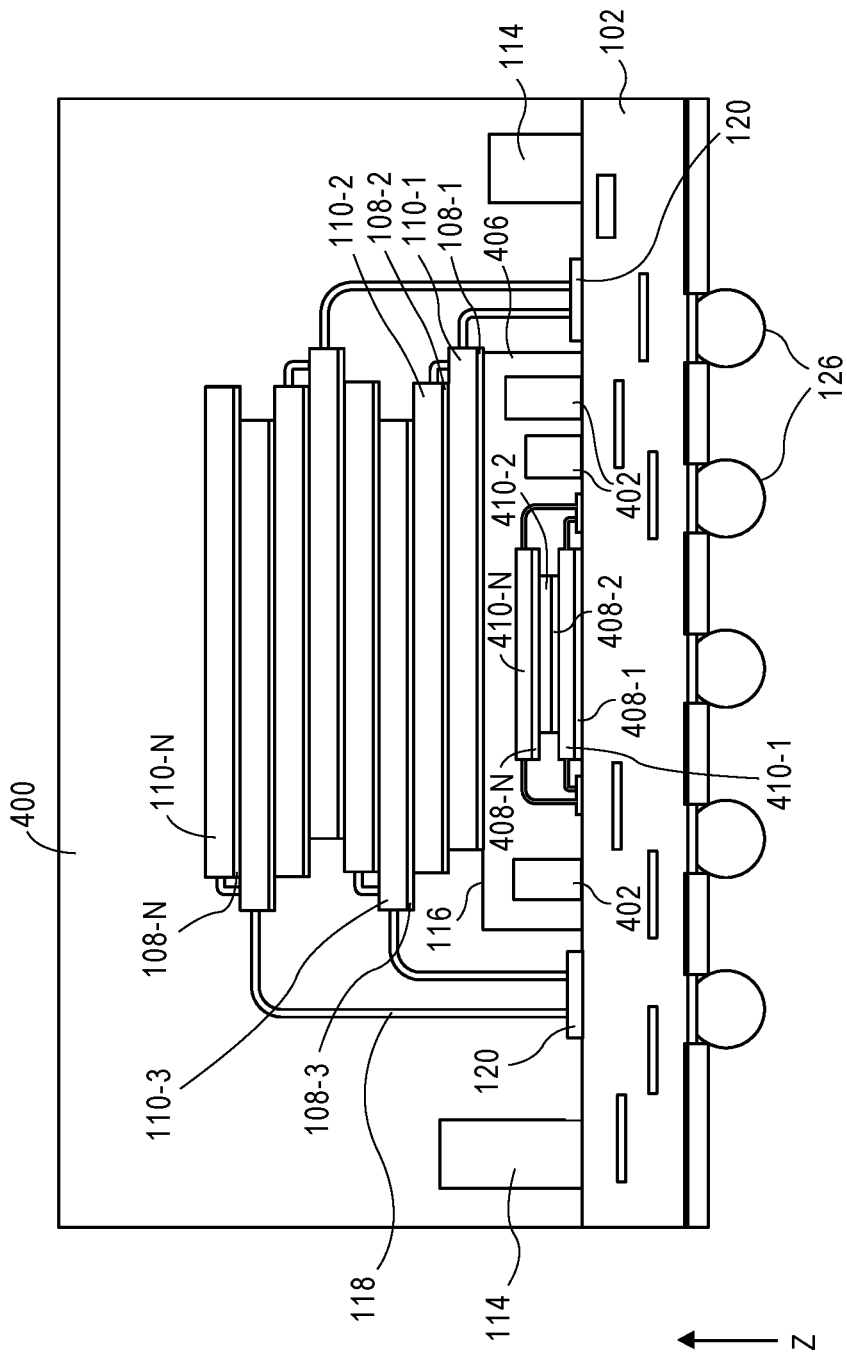
FIG. 4 is a diagram of an alternative embodiment of the invention.

FIG. 4 is a diagram of an alternative embodiment of the invention. This embodiment is, in many respects, similar to that shown and described with references to FIG. 1. However, one or more ASICs 410-1 through 410-$n$ are mounted on the substrate to be enveloped in the molding compound. The ASICs 410 may be coupled to the substrate and in a stack to each other using die attach film 408-1 through 408-$n$. Passives 402 are mounted to the substrate 102 around the ASICs 410. The passives 402 and ASICs 410 are collectively enveloped in the molding compound that forms the platform for the die stack 110-1 through 110-$n$. Because ASICs tend to be small, inclusion of the ASICs within the platform has been found to be an effective way to increase the SIP capabilities while reducing the area occupied by the SIP 400.

Figure 5:
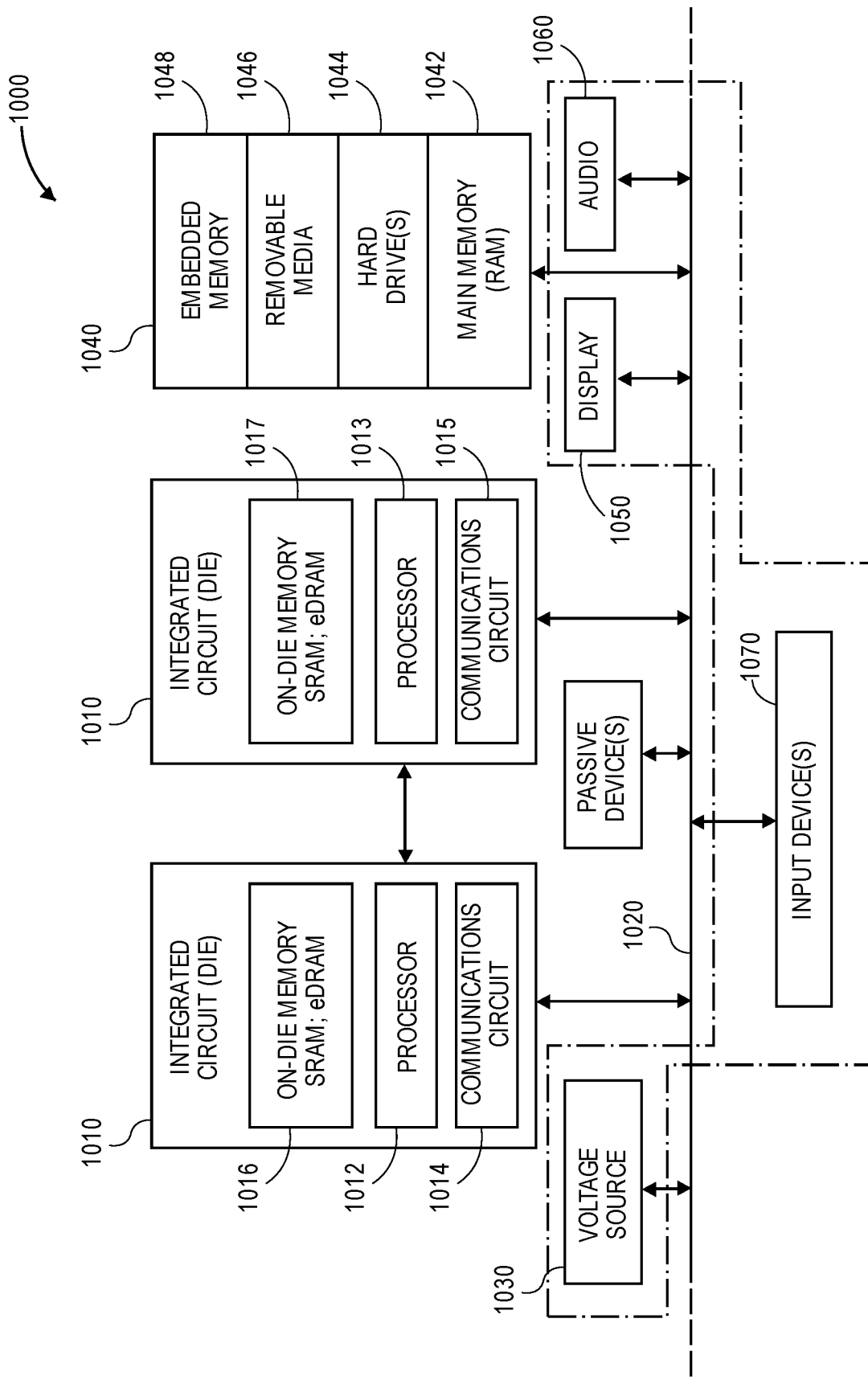
FIG. 5 is a block diagram of a system according to one embodiment of the invention.

FIG. 5 is a block diagram of a system according to one embodiment of the present invention. The computer system 1000 (also referred to as the electronic system 1000) as depicted can embody a SIP, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a SIP as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder. In an embodiment, an input device is a touch screen that may be part of display device 1050.

As shown herein, the integrated circuit 1010 can be implemented in a number of different embodiments, including a SIP, according to any of the several disclosed embodiments and their equivalents, an electronic system, a computer system, one or more methods of fabricating an integrated circuit, and one or more methods of fabricating an electronic assembly that includes a SIP, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed SIP embodiments and their equivalents. A foundation substrate may be included, as represented by the dashed line of FIG. 5. Passive devices may also be included, as is also depicted in FIG. 5.

The following examples pertain to further embodiments. The various features of the different embodiments may be variously combined with some features included and others excluded to suit a variety of different applications. Some embodiments relate to a system in package having a substrate with a plurality of passive devices mounted thereon. A molding compound envelopes the plurality of passive devices to define a flat surface substantially parallel to a surface of the substrate. A plurality of integrated circuit dies is coupled successively to the flat surface.

In further embodiments, the substrate is a printed circuit board.

In further embodiments, at least one application-specific integrated circuit (ASIC) is coupled to the substrate and enveloped within the molding compound.

In further embodiments, each integrated circuit die coupled to the flat surface has substantially the same thickness.

In further embodiments, a second plurality of passive devices are coupled to the substrate and outside the molding compound.

In further embodiments, the passive devices within the molding compound have different z dimensions.

In further embodiments, a layer of die-attached film couples a first integrated circuit die to the flat surface of the molding compound and successive layers of die-attached film couple together successive dies to form a stack.

In further embodiments, each layer of the die-attached film has substantially a same thickness.

In further embodiments, the molding compound is an epoxy resin.

Some embodiments pertain to a method in which a plurality of passive devices are mounted on a substrate. A platform with a substantially planar upper surface parallel to the surface of the substrate is molded, enveloping the plurality of passive devices. A first integrated circuit die is coupled to the planar surface. Additional integrated circuit dies are coupled to the first die and then successively to form a die stack.

In further embodiments, the integrated circuit dies are wire bonded to the substrate.

In further embodiments, an application-specific integrated circuit (ASIC) is coupled to the substrate prior to the molding.

In further embodiments, a mold is overlaid over the plurality of passive devices. Molding compound is introduced into the mold through a pin gate and cured within the mold.

In further embodiments, a mold that defines a molding channel encompassing the passive devices is introduced. A molding compound is flowed along the channel and cured.

In further embodiments, the passive devices and the integrated circuit dies are encapsulated within a unitary package.

Some embodiments relate to a system including a system in package having a substrate with a plurality of passive devices mounted thereon. A molding compound envelopes the plurality of passive devices to define a flat surface substantially parallel to a surface of the substrate. A plurality of integrated circuit dies is coupled successively to the flat surface. The SIP communicates with a display and a microphone input device.

In further embodiments, the display has a touch screen.

In further embodiments, the system in package includes a plurality of passive devices coupled to the substrate, external to the molding compound.

In further embodiments, the system in the package has an application-specific integrated circuit (ASIC) coupled to the substrate and enveloped within the molding compound.

Some embodiments relate to a system in package having a substrate with a plurality of passive devices mounted thereon. The plurality of passive devices are enveloped to define a flat surface substantially parallel to a surface of the substrate. A plurality of integrated circuit dies is coupled successively to the flat surface.

In further embodiments, at least one application-specific integrated circuit (ASIC) is coupled to the substrate and enveloped beneath the surface.

Further embodiments include means for coupling the integrated circuit dies into a stack on the flat surface.

While embodiments of the invention are discussed above in the context of flow diagrams reflecting a particular linear order, this is for convenience only. In some cases, various operations may be performed in a different order than shown or various operations may occur in parallel. It should also be recognized that some operations described with respect to one embodiment may be advantageously incorporated into another embodiment. Such incorporation is expressly contemplated.

In the foregoing specification, the invention has been described with reference to the specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A system in package comprising:
a substrate;
a plurality of passive devices mounted on the substrate;
a molding compound enveloping the plurality of passive devices to define an enclosed platform, wherein the enclosed platform has a flat surface substantially parallel to a surface of the substrate, wherein one or more passive devices of the plurality of passive devices has a thickness that is different than a thickness of the other passive devices of the plurality of passive devices, and wherein the flat surface of the enclosed platform occupies an x-y space; and
a plurality of integrated circuit dies disposed on the flat surface of the enclosed platform, wherein each of the plurality of integrated circuit dies has a width that is less than a width of the enclosed platform, wherein the plurality of integrated circuit dies are not encased within the molding compound of the enclosed platform, wherein the plurality of integrated circuit dies are coupled successively to the flat surface of the enclosed platform, wherein the plurality of integrated circuit dies comprises a first die, a second die, and a third die stacked in a stair configuration, and wherein a combination of the first die, the second die, and the third die has a footprint within the x-y space occupied by the flat surface of the enclosed platform.

2. The system in package of claim 1 wherein the substrate is a printed circuit board.

3. The system in package of claim 1 further comprising:
at least one application-specific integrated circuit (ASIC) coupled to the substrate and enveloped within the molding compound of the enclosed platform, wherein the at least one ASIC has a width that is less than the width of the plurality of integrated circuit dies.

4. The system in package of claim 1 wherein each integrated circuit die of the plurality of integrated circuit dies has substantially a same thickness.

5. The system in package of claim 1 further comprising:
a second plurality of passive devices coupled to the surface of the substrate, wherein the second plurality of passive devices are not encased within the molding compound of the enclosed platform.

6. The system in package of claim 5 wherein the thickness of the one or more passive devices of the plurality of the passive devices is different than a thickness of the second plurality of passive devices.

7. The system in package of claim 1 further comprising:
a layer of die-attached film coupling a first integrated circuit die to the flat surface of the enclosed platform and successive layers of die-attached film coupling together successive dies of the plurality of integrated circuit dies.

8. The system in package of claim 7 wherein each layer of the die-attached film has substantially a same thickness.

9. The system in package of claim 1 wherein the molding compound is an epoxy resin.

10. A method of making a system in package comprising:
mounting a plurality of passive devices on a substrate;
molding an enclosed platform enveloping the plurality of passive devices, the enclosed platform having a substantially planar surface substantially parallel to a surface of the substrate, wherein one or more passive devices of the plurality of passive devices has a thickness that is different than a thickness of the other passive devices of the plurality of passive devices, and wherein the substantially planar surface of the enclosed platform occupies an x-y space;
coupling a first integrated circuit die onto the substantially planar surface of the enclosed platform; and
coupling a plurality of integrated circuit dies successively to the first integrated circuit die to form a die stack, wherein the first integrated circuit die and each of the plurality of integrated circuit dies have a width that is less than a width of the enclosed platform, wherein the die stack is not encased within the enclosed platform, wherein the plurality of integrated circuit dies comprises a second integrated circuit die, and a third integrated circuit die, wherein the first integrated circuit die, the second integrated circuit die, and the third integrated circuit die are stacked in a stair configuration, and wherein a combination of the first integrated circuit die, the second integrated circuit die, and the third integrated circuit die has a footprint within the x-y space occupied by the substantially planar surface of the enclosed platform.

11. The method of claim 10 further comprising:
wire bonding the plurality of integrated circuit dies to the substrate.

12. The method of claim 10 further comprising:
coupling an application-specific integrated circuit (ASIC) to the substrate prior to the molding, wherein the ASIC is enveloped within the enclosed platform, and wherein the ASIC has a width that is less than the width of both the first integrated circuit die and the plurality of integrated circuit dies.

13. The method of claim 10 wherein molding comprising:
overlaying a mold over the plurality of passive devices;
introducing a molding compound into the mold through a pin gate;
curing the molding compound.

14. The method of claim 10 wherein molding comprising:
introducing a mold that defines a molding channel encompassing the passive devices; and
flowing a molding compound along the channel; and
curing the molding compound.

15. The method of claim 14 further comprising:
encapsulating the passive devices and the ASIC within a unitary package; and
coupling a second plurality of passive devices to the surface of the substrate, wherein the second plurality of passive devices are not encased within the molding compound of the enclosed platform, and wherein the thickness of the one or more passive devices of the plurality of the passive devices is different than a thickness of the second plurality of passive devices.

16. A system comprising:
a system in package including:
a substrate;
a plurality of passive devices mounted on the substrate;
a molding compound enveloping the plurality of passive devices to define an enclosed platform, wherein the enclosed platform has a flat surface substantially parallel to a surface of the substrate, wherein one or more passive devices of the plurality of passive devices has a thickness that is different than a thickness of the other passive devices of the plurality of passive devices, and wherein the flat surface of the enclosed platform occupies an x-y space; and
a plurality of memory integrated circuit dies disposed on the flat surface of the enclosed platform, wherein each of the plurality of memory integrated circuit dies has a width that is less than a width of the enclosed platform, wherein the plurality of memory integrated circuit dies are not encased within the molding compound of the enclosed platform, wherein the plurality of memory integrated circuit dies are coupled successively to the flat surface of the enclosed platform, wherein the plurality of memory integrated circuit dies comprises a first die, a second die, and a third die stacked in a stair configuration, and wherein a combination of the first die, the second die, and the third die has a footprint within the x-y space occupied by the flat surface of the enclosed platform;
a display; and
a microphone input device.

17. The system of claim 16 wherein the display comprises:
a touch screen.

18. The system of claim 16 wherein the system in package further comprises:
a second plurality of passive devices coupled to the surface of the substrate, wherein the second plurality of passive devices are not encased within the molding compound of the enclosed platform.

19. The system of claim 16 wherein the system in package further comprises:
an application-specific integrated circuit (ASIC) coupled to the substrate and enveloped within the molding compound of the enclosed platform, wherein the ASIC has a width that is less than the width of the plurality of memory integrated circuit dies.

* * * * *